Aug. 6, 1968 E. K. VON FANGE 3,396,341

I.F. FILTER FOR TELEVISION TUNER

Filed May 3, 1965

INVENTOR:
EUGENE K. VON FANGE,
BY William S. Wolfe
HIS ATTORNEY.

3,396,341

I.F. FILTER FOR TELEVISION TUNER

Eugene K. Von Fange, Syracuse, N.Y., assignor to General Electric Company, a corporation of New York Filed May 3, 1965, Ser. No. 452,498
5 Claims. (Cl. 325—477)

ABSTRACT OF THE DISCLOSURE

An I.F. filter comprising substantially mutually coupled parallel and series LC resonant circuits is coupled to an input tuned circuit of an RF transistor amplifier. The series resonant circuit is connected between ground and the junction between the parallel resonant circuit and the input tuned circuit. The parallel resonant circuit is tuned to a frequency of 41 mc. while the series resonant circuit is tuned to a frequency of 46 mc. to provide I.F. rejection in the 41–46 mc. band.

Figure 1:
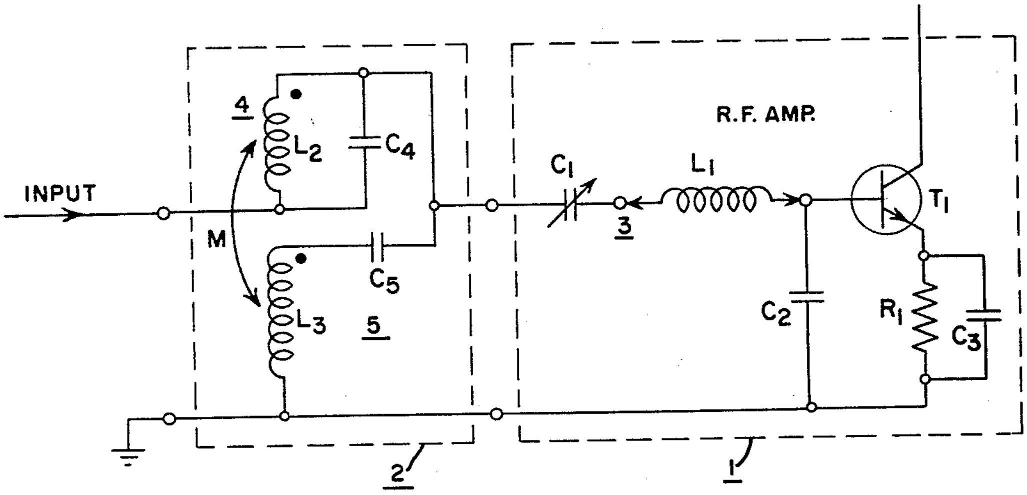

The present invention relates to television circuitry and more specifically to an improved I.F. filter for use with the VHF tuner of a television receiver.

It is necessary to employ an I.F. filter at the input of a VHF tuner, the filter being required for I.F. rejection in order to prevent the unimpeded passage of signals in the I.F. range through the tuner. Typically, such filters must provide 50 to 60 db of I.F. rejection in a frequency range of about 41 to 46 mc.

In the past the television industry has employed an I.F. filter of the familiar m-derived type to obtain the necessary I.F. rejection. However, the use of a filter of this type raises several problems which are compounded where the filter is utilized in conjunction with a transistorized tuner.

Specifically, the m-derived filter necessitates the use of a relatively large number of inductive and capacitive elements and thus is relatively expensive.

Further, the m-derived filter is not completely compatible with transistorized VHF tuners. In this regard, the input impedance of the R.F. transistors conventionally employed in VHF tuners increases rapidly at frequencies below 80 mc. while the impedance of the filter decreases. This produces a serious impedance mismatch at the channel 2 frequency of 57 mc. As a result of this mismatch the tuner exhibits a poor noise figure at channel 2.

The present invention provides an improved I.F. filter for a VHF tuner which overcomes the prior art problems in an expensive fashion.

Accordingly, an object of the invention is to provide an improved I.F. filter for use with VHF tuners.

Another object is to provide an improved I.F. filter which utilizes fewer components than the I.F. filter conventionally employed with VHF tuners.

Still another object is to provide an improved I.F. filter which is compatible with the requirements of a transistorized VHF tuner.

These and other objects are achieved in one embodiment of the invention through the use of a filter comprising mutually coupled parallel and series resonant circuits. A parallel resonant circuit is connected to the input tuned circuit of the R.F. transistor. A series resonant circuit is connected between ground and the junction between the parallel resonant circuit and the input tuned circuit. The inductances of the parallel and series resonant circuits are mutually coupled. Tuning is effected by tuning the parallel resonant circuit to 41 mc. with the series resonant circuit detuned and then tuning the series resonant circuit to approximately 46 mc.

In accordance with an important feature of the invention the circuit values of the parallel and series resonant circuits are selected so that the equivalent capacitance of the parallel resonant circuit and the equivalent inductance of the series resonant circuit at channel 2 are equal to the values necessary to provide the best noise figure at channel 2 through transformation of the source impedance seen by the transistor to an optimum level. In this manner compatability with the requirements of the R.F. transistor is achieved in inexpensive fashion.

Figure 2:
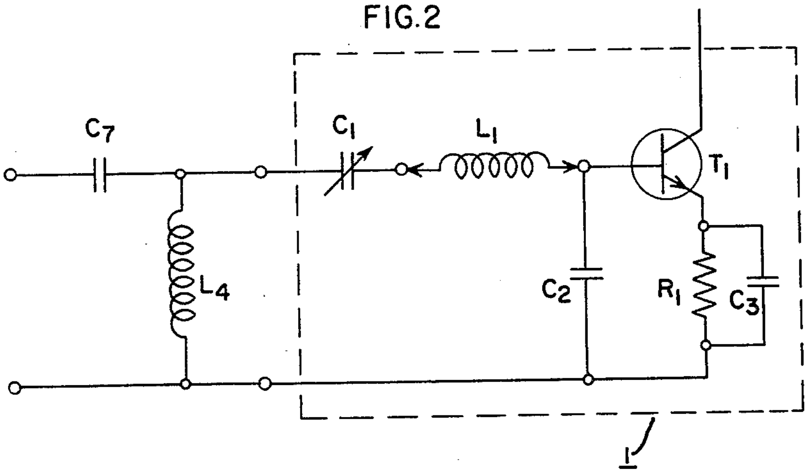

The novel and distinctive features of the invention are set forth in the appended claims. The invention itself together with further objects and advantages thereof, may best be understood by reference to the following description and accompanying drawings in which:

FIGURE 1 is a schematic diagram of the improved I.F. filter of the invention, and FIGURE 2 is a schematic diagram of a circuit utilized to determine the circuit values of the I.F. filter of FIGURE 1.

Referring to FIGURE 1, there is shown the input portion of a VHF tuner comprising an R.F. amplifier generally shown at 1 and an I.F. filter in accordance with the invention generally shown at 2.

The R.F. stage 1 comprises an R.F. amplifier in the form of a transistor $T_1$ to the base of which is applied the R.F. signal through an input tuned circuit comprising serially connected capacitor $C_1$ and inductor $L_1$. In conventional fashion a discrete inductor $L_1$ is connected in the circuit at each channel to perform the necessary tuning function. A capacitor $C_2$ is connected between the base of the transistor $T_1$ and ground to minimize detuning of the input tuned circuit with AGC and to transform the transistor input impedance to the level needed for good noise figures and power match with the antenna input impedance. A resistance $R_1$ bypassed by a capacitor $C_3$ is connected between the emitter of the transistor $T_1$ and ground to establish the operating point of the transistor $T_1$. The amplified R.F. signal as derived from the collector of the transistor $T_1$ is applied to a suitable converter stage (not shown) to develop an I.F. signal.

The I.F. filter 2 in accordance with the invention is connected to the input tuned circuit 3 of the R.F. amplifier to prevent the unimpeded passage of signals at the I.F. frequency through the R.F. stage.

The I.F. filter 2 comprises a parallel resonant circuit 4 including an inductor $L_2$ and capacitor $C_4$, the parallel resonant circuit being serially connected between the input to the I.F. filter and the input tuned circuit 3 of the R.F. stage 1.

A series resonant circuit 5 is connected from the junction between the parallel resonant circuit 4 and the input tuned circuit 3 of the R.F. amplifier to ground. The series resonant circuit 5 comprises an inductor $L_3$ and a capacitor $C_5$, the inductor $L_3$ being mutually coupled to the inductor $L_2$ with a polarity as shown.

The parallel resonant circuit 4 is tuned to 41 mc. with the series resonant circuit detuned, while the series resonant circuit is subsequently tuned to approximately 46 mc. the parallel resonant circuit 4 and series resonant circuit 5 with the proper mutual coupling thus defining a band rejection filter at the I.F. frequency. The coupling between the inductors $L_2$ and $L_3$ can be varied to control the bandwidth and flatness of the filter characteristic.

In accordance with the invention, the values of the circuit elements of the filter are selected to provide the best noise figures at the channel 2 frequency by utilizing the filter to transform the source impedance seen by the R.F. transistor $T_1$ to a level compatible with the relatively high input impedance of the transistor at the channel 2 frequency. Further, through the use of circuit elements selected in this fashion the source impedance decreases as frequency is increased in the same manner as the input impedance of the transistor and impedance compatibility is obtained over a wide range of frequencies.

Since the parallel resonant circuit 4 appears capacitive at channel 2 and the series resonant circuit 5 appears inductive at that channel, the circuit of FIGURE 2 can be employed to experimentally determine the equivalent capacitance $C_7$ of the parallel resonant circuit 4 and the equivalent inductance $L_4$ of the series resonant circuit 5 for the best noise figure at channel 2. In the circuit of FIGURE 2 like reference numerals are utilized for those elements common to FIGURE 1. Once the optimum values for the equivalent capacitance $C_7$ and the equivalent inductance $L_4$ is determined for a particular transistor, the reactance of these elements at the channel 2 frequency of 57 mc. can be utilized to calculate the actual values of the circuit elements of the parallel resonant circuit 4 and series resonant circuit 5 as follows.

In calculating the values of the capacitor $C_4$ and inductor $L_4$, the impedance of the equivalent capacitance $C_7$ can be written;

$$Z_e=\frac{1}{J\omega_2 C_7} \qquad (1)$$

where $\omega_2=2\pi f_2$ and $f_2$ is the median channel 2 frequency of 57 mc.

Further, the admittance of the parallel resonant circuit 4 at the channel 2 frequency can be written;

$$Y_p=\frac{1}{JaX_p}+\frac{1}{-J/aX_p} \qquad (2)$$

where $$a=\frac{\omega_2}{\omega_1}$$

$\omega_1=2\pi f_1$ and $f_1$ is the resonant frequency of the parallel resonant circuit 4, or 41 mc. so that $a=1.39$, and $X_p$ is the impedance of the inductor or capacitor at 41 mc.

Thus from Equation 2 the impedance of the parallel resonant circuit 4 becomes;

$$Z_p=\frac{-JX_p}{(a-1/a)} \qquad (3)$$

Hence from Equation 3;

$$X_p=(a-1/a)Z_p \qquad (4)$$

Since in accordance with the invention $Z_p$ must equal the equivalent impedance $Z_e$ Equation 4 becomes;

$$X_p=(a-1/a)\frac{1}{\omega_2 C_7} \qquad (5)$$

Calculating the value of $C_4$;

$$C_4=\frac{1}{\omega_1 X_p} \qquad (6)$$

By substituting from Equation 5 Equation 6 becomes;

$$C_4=\frac{1}{\omega_1(a-1/a)\frac{1}{\omega_2 C_7}} \text{ or } C_4=\frac{aC_7}{a-1/a} \qquad (7)$$

Thus the value for $C_4$ with respect to $C_7$ becomes;

$$C_4=2.08C_7 \qquad (8)$$

The center value of $L_2$ can then be calculated from the the following formula;

$$L_2=\frac{1}{(2\pi f_1)^2 C_4} \qquad (9)$$

The actual coil would, of course, have a somewhat higher inductance to permit "knifing" the circuit to the desired resonant frequency.

By a similar process the values of the capacitor $C_5$ and inductor $L_3$ become;

$$L_3=\left(\frac{b}{b-\frac{1}{b}}\right)L_4 \qquad (10)$$

where:

$$b=\frac{\omega_2}{\omega_3}\,\omega_2=2\pi f_2$$

$\omega_2=2\pi f_2$ and $f_2$ is the median channel 2 frequency or 57 mc. and $\omega_3=2\pi f_3$ where $f_3$ is the resonant frequency of the series resonant circuit or 46 mc.

Since $b=1.24$ Equation 10 becomes;

$$L_3=2.88L_4 \qquad (11)$$

The value of $C_5$ can then be calculated from the following formula $$C_5=\frac{1}{(2\pi f_3)^2 L_3} \qquad (12)$$

In one particularly successful embodiment of the invention the values of the equivalent capacitance $C_7$ and equivalent inductance $L_4$ of the circuit of FIGURE 2 were experimentally determined to be 18.3 pf. and 565 nh. respectively.

Utilizing the value thus obtained for $C_7$ in Equation 8 the value for $C_4$ becomes 38 pf. From Equation 9 the value of $L_2$ accordingly becomes 396 nh.

Similarly, utilizing the experimentally determined value of $L_4$ in Equation 11, the value of the inductor $L_3$ becomes 1626 nh. The value of capactor $C_5$ is thus determined from Equation 12 as 7.37 pf.

In the particularly successful embodiment of the invention the following circuit values were accordingly employed with a SE5003 transistor; the coils $L_2$ and $L_3$ including sufficient reserve inductance to permit tuning thereof:

$C_4$—39 pf.
$C_5$—10 pf.
$L_2$—470 nh., a coil being employed having 11¾ turns of AWG #26 enameled wire close wound to 0.225 inch outer diameter.
$L_3$—1130 nh., a coil being employed having 22¾ turns of AWG #26 enameled wire close wound to 0.225 inch outer diameter.

The inductors $L_2$ and $L_3$ were axially aligned with the proper polarity and the coupling varied by physical displacement of the inductors to provide an optimally flat filter characteristic. It will be noted that the actual circuit values employed differ somewhat from the calculated values, these differences resulting from the ignoring of mutual coupling effects in order to simplify the analysis. Thus, in the embodiment discussed above the values of $C_5$ and $L_3$ were adjusted somewhat from the calculated values to obtain optimum noise figures for a wide selection of transistors.

The I.F. filter in accordance with the invention was found to provide the requisite high degree of I.F. rejection even though a minimum number of components are required. Further, the I.F. filter in accordance with the invention serves to transform the source impedance to a level compatible with the high input impedance of the R.F. transistor at channel 2 to provide improved operation. At higher frequencies the I.F. filter in accordance with the invention causes the source impedance to decrease in the same manner as the input impedance of the R.F. transistor to thereby provide impedance compatibility over a wide range of frequencies. The I.F. filter of the invention is thus completely compatible with the requirements of transistorized VHF tuners.

Although the invention has been described with respect to certain specific embodiments, it will be appreciated that further modifications and changes may be made by those skilled in the art without departing from the true spirit and scope of the invention.

What is claimed and desired to be secured by Letters Patent of United States is:

1. An I.F. filter for a television tuner including an R.F. input and an R.F. transistor having the output of a tuned circuit connected thereto, said filter comprising;

(a) a parallel resonant circuit connected between said R.F. input and the input of said tuned circuit, said parallel resonant circuit including a first inductor and first capacitor, (b) a series resonant circuit connected between the input of said tuned circuit and a reference point, said series resonant circuit including a second inductor and second capacitor, and (c) said first and second inductors being substantially mutually coupled.

2. The I.F. filter defined in claim 1 wherein said parallel resonant and said series resonant circuits are resonant at frequencies of substantially 41 mc. and 46 mc. respectively.

3. The I.F. filter defined in claim 2 wherein the values of said first and second inductors and said first and second capacitors are selected so that the equivalent capacitance and equivalent inductance of said parallel resonant circuit and said series resonant circuit respectively at the channel 2 frequency are those required to transform the source impedance at said R.F. input to a level providing a minimum noise figure for said transistor.

4. The I.F. filter defined in claim 3 wherein said first inductor and said second inductor are axially aligned.

5. The I.F. filter defined in claim 1 wherein said parallel and series resonant circuits are resonant at frequencies differing by more than .5 mc.

References Cited

UNITED STATES PATENTS 3,018,369 1/1962 Holmes ____________ 325—318

OTHER REFERENCES

Buchsbaum, W. H: Eliminating 21 mc. Interference; In Radio and Television News, pp. 48–49, October 1952.

KATHLEEN H. CLAFFY, *Primary Examiner.*

R. LINN, *Assistant Examiner.*